United States Patent [19]
Yin

[11] Patent Number: 5,671,182
[45] Date of Patent: Sep. 23, 1997

[54] SRAM MEMORY CIRCUIT AND METHOD OF OPERATION THEREFOR

[76] Inventor: Ronald Loh-Hwa Yin, 547 Sullivan Dr., Mountain View, Calif. 94041

[21] Appl. No.: 735,661

[22] Filed: Oct. 24, 1996

[51] Int. Cl.$^6$ .................................................. G11C 11/36
[52] U.S. Cl. ........................... 365/189.05; 365/175
[58] Field of Search ........................ 365/189.05, 175, 365/154, 230.03

[56] References Cited

U.S. PATENT DOCUMENTS

| | | | |
|---|---|---|---|
| 3,986,173 | 10/1976 | Baitinger et al. | 340/173 R |
| 4,247,918 | 1/1981 | Iwashashi et al. | 365/218 |
| 5,063,539 | 11/1991 | Rallapalli | 365/175 |
| 5,535,156 | 7/1996 | Levy et al. | 365/175 |

OTHER PUBLICATIONS

"Pinch Load Resistors Shrink Bipolar Memory Cells" by S.K. Wiedmann, *Electronics*, Mar. 7, 1974, pp. 130–133.

*Primary Examiner*—Son T. Dinh

[57] ABSTRACT

A memory array circuit has two memory sections. Each memory section has a matrix of column lines and row lines. A plurality of storage latches are arranged in the matrix, with each storage latch having a data node, and a voltage node. Each of the plurality of storage latches has an associated column line and an associated row line, with the voltage node connected to the associated row line. A diode connects the data node of a storage latch to its associated column line. A first decoder decodes a first address signal and selects one of the column lines. A second decoder decodes a second address signal, and generates a row output signal, with each row output signal of the second decoder having a corresponding row line. A plurality of voltage control circuits is provided with each voltage control circuit receiving one of the plurality of row output signals, and for applying a control signal to a corresponding row line, in response to a data read signal, a data write to one state signal or a data write to another state signal. A plurality of sense amplifiers differentially senses corresponding column lines of the two memory sections.

20 Claims, 5 Drawing Sheets

SRAM MEMORY CIRCUIT AND METHOD OF OPERATION THEREFOR

TECHNICAL FIELD

The present invention relates to a semiconductor memory array circuit, and more particularly to an SRAM memory array circuit whose memory cells are arranged in a matrix of rows and columns, with diodes connecting the memory cells to the rows and columns to write data signals into or to read data signals out of a selected memory cell.

BACKGROUND OF THE INVENTION

Semiconductor memory array circuits are well known in the art. There are three types of memory cells which can electrically write data signals into a memory cell and electrically read data signals out of a selected memory cell.

The first type, using a capacitor, is called a Dynamic Random Access Memory (DRAM). The second type, using a latch, is called a Static Random Access Memory (SRAM). A third type using a floating gate to store charges, which controls the action of a channel of a transistor is called Electrically Erasable Programmable Read Only Memory (EEPROM).

In all three types of semiconductor memory array circuit, the memory cells are arranged in a matrix of columns and rows. A column line and a row line can select a particular select transistor which is connected to an associated memory cell. During writing, a data signal (which can be "1" or "0") to be stored in a selected memory cell is supplied on a column line. The activation of a particular row line, which is connected to the gate of a select transistor, causes the data signal to be passed through the select transistor associated with the select memory cell and to be stored in the select memory cell.

In a DRAM device the memory cell is a capacitor with one electrode of the capacitor connected to the selected transistor, and the other electrode of the capacitor connected to ground. The memory array is typically segmented into two sections. During read, the corresponding column lines of the two memory sections are pre-charged. The select capacitor in one memory section is connected to one precharged column line. A sense amplifier differentially senses the charges between the two pre-charged column lines.

In an SRAM device there are two column lines with two select transistors, causing the data signal and its complement to be stored in the latch. During read operation, a particular pair of column line is precharged. A particular row line is then activated turning on the pair of select transistors causing the state of the selected memory cell to be read out and supplied to the precharged column lines. The change on the charge of the pre-charged column lines from one another determines the state of the selected memory cell.

In U.S. Pat. No. 3,986,173 reference is made to the use of diodes to transfer data signals into a bipolar latch. However, the diodes were deemed not suitable and disclosure is made to the use of select transistors. In addition, that reference taught the use of tow column lines per latch. see also "Pinch Load resistors Shrink Bipolar Memory Cells" by S. K. Wiedmann, *Electronics*, Mar. 7, 1974, p. 130–133.

In a flash EEPROM, the charges stored on a floating gate of the selected transistor determines the amount of current that passes through the channel of the select transistor.

Semiconductor memory designers have sought to increase the density of semiconductor memory array circuit, by packing more memory cells in each integrated circuit. This has been accomplished primarily by reducing the size of the transistors which are used in the memory array circuit. However, each transistor is fabricated laterally or planarly on a semiconductor substrate, such as single crystalline silicon. Thus, select transistors take up lateral surface area on a semiconductor substrate.

Control circuits interfacing a row decoder and row lines for controlling the voltages applied to the row lines during read, erase, and program in an EEPROM device is also well known in the art. See for example, U.S. Pat. No. 4,427,918.

SUMMARY OF THE INVENTION

The present invention comprises an arrangement of two memory sections. Each memory section comprises a plurality of first lines and a plurality of second lines. The plurality of first lines and plurality of second lines define a matrix. A plurality of latches are arranged in said matrix, with each latch having a data node, a first voltage node, and a second voltage node. Each of the plurality of latches has an associated first line, and an associated second line, with the first voltage node connected to the associated second line. Each memory section also has a plurality of avalanche diodes, with each avalanche diode connecting the data node of a latch to its associated first line. A first decoder means decodes a first address signal and selects one of the plurality of first lines. A second decoder means decodes a second address signal and generates one of a plurality of output signals. Each of the plurality of output signals has a corresponding second line. Each memory section also has a plurality of voltage control means, with each voltage control means receiving one of the plurality of output signals, and applying a control signal to said corresponding second line, in response to a data read signal, a data write to one state signal or a data write to another state signal. A plurality of sense amplifier means connects the first lines of one memory section and the corresponding first lines of the other memory section, and differentially senses them.

DETAILED DESCRIPTION OF THE DRAWINGS

First Embodiment of a Memory Array Circuit

Figure 1:
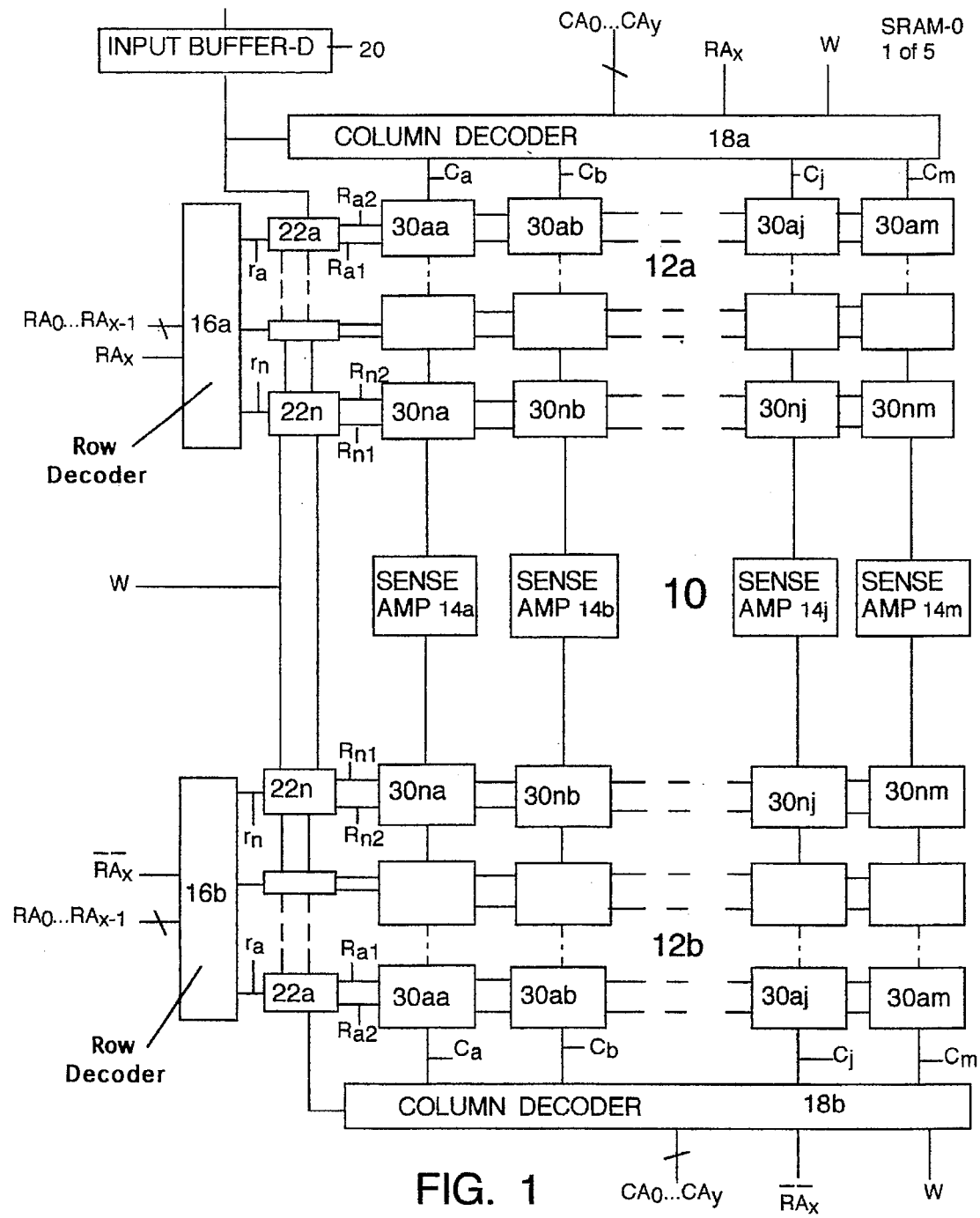
FIG. 1 is a schematic block level diagram of a first embodiment of a memory array circuit of the present invention, suitable for use with SRAM memory units comprising latches.

Referring to FIG. 1 there is shown a block diagram of a first embodiment of a semiconductor memory array circuit 10 of the present invention. The circuit 10 comprises two sections of memory units: first memory section 12a and second memory section 12b. The first memory section 12a comprises a plurality of data memory units $30aa \ldots 30nm$ arranged in a plurality of n rows and a plurality of m columns, connected by a first plurality of n row lines $R_{a1} \ldots R_{n1}$, and a second plurality of n row lines $R_{a2} \ldots R_{n2}$ and a plurality of m column lines $C_a \ldots C_m$. Each memory unit $30ij$ has an associated first row line $R_{i1}$ and an associated second row line $R_{i2}$. Thus, each first row line $R_{a1} \ldots R_{n1}$, has an associated second row line $R_{a2} \ldots R_{n2}$.

Figure 2:
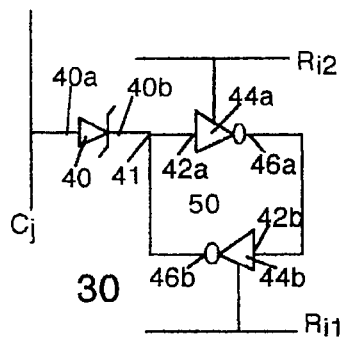
FIG. 2 is a circuit diagram of a first embodiment of an SRAM memory unit for use in the embodiment of the memory array circuit of the present invention shown in FIG. 1.
Figure 8:
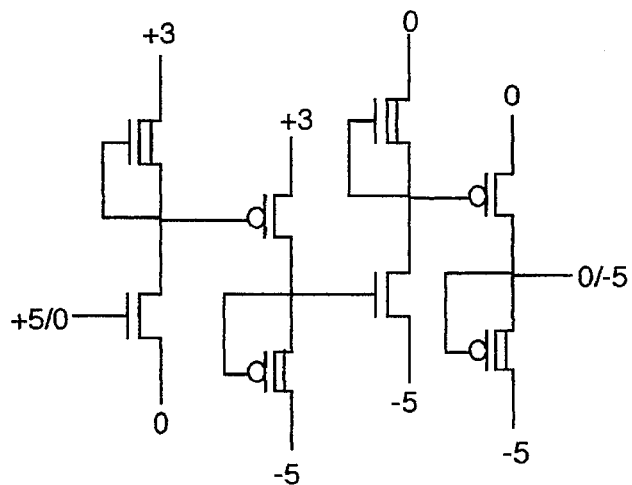
FIG. 8 is a circuit diagram of an example of a voltage level shifter for shifting an input signal of +5/0 volts and for outputting a signal of 0/−5 volts.

The second memory section 12b also comprises a plurality of data memory units $30aa \ldots 30nm$ also arranged in a plurality of n rows and a plurality of m columns, connected by a first plurality of n row lines $R_{a1} \ldots R_{n1}$, a second plurality of n row lines $R_{a2} \ldots R_{n2}$, and a plurality of m column lines $C_a \ldots C_m$. Each of the memory units 30 comprises a SRAM latch 50 (which is shown in FIGS. 2 or 8, with each latch 50 shown in greater detail in FIGS. 3a or 3b) and a diode 40.

A sense amplifier 14 connects each column line, e.g. $C_j$, of the first memory section 12a to a corresponding column line, e.g. $C_j$, of the second memory section 12b. The sense amplifier 14, e.g. 14j, differentially senses the charges on a column line, e.g. $C_j$, of the first memory section 12a, caused by a data memory unit 30, e.g. any of the memory units $30aj \ldots 30nj$, of the first memory section 12a being connected thereto, with the charges on a corresponding column line $C_j$, of the second memory section 12b. The output of each sense amplifier 14 is supplied to an output buffer (not shown).

Within the first memory section 12a, the circuit 10 comprises a first row decoder 16a for receiving and decoding a row address signal $RA_0 \ldots RA_{(x-1)}$. The first row decoder 16a also receives the row address signal $RA_x$. In accordance with industry standard, the row address signals $RA_0 \ldots RA_x$ can be the address signals $A_0 \ldots A_x$ supplied to the array circuit 10 strobed by a control signal RAS. The first row decoder 16a decodes the row address signal $RA_0 \ldots RA_{(x-1)}$, if the row address signal $RA_x$ is high. The output of the first row decoder 16a is a plurality of row output signals, $r_a \ldots r_n$. Each of the row output signals, $r_a \ldots r_n$, is supplied to a respective control circuit $22a \ldots 22n$. Each of the control circuits $22a \ldots 22n$ has a corresponding first row line $R_{a1} \ldots R_{n1}$, and a second row line $R_{a2} \ldots R_{n2}$. Each of the control circuits 22 receives one of the row output signals $r_a \ldots r_n$ and the read/write signal W and the state of the input signal D, and in response thereto, supplies an appropriate control signal to its corresponding first row lines $R_{a1} \ldots R_{n1}$, and second row lines $R_{a2} \ldots R_{n2}$. The read/write signal W is an active low write signal. Thus, W high indicates active read.

Within the second memory section 12b, the circuit 10 comprises a second row decoder 16b for receiving and decoding the row address signal $RA_0 \ldots RA_{(x-1)}$, which is the same row address signal supplied to the first row decoder 16a. The second row decoder 16b also receives the row address signal $\overline{RA_x}$. The second row decoder 16b decodes the row address signal $RA_0 \ldots RA_{(x-1)}$, if the row address signal $\overline{RA_x}$ is high. Thus, although the same row address signal $RA_0 \ldots RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b generates a plurality of row output signals, $r_a \ldots r_n$, in response to the row address signal $RA_0 \ldots RA_{(x-1)}$. Each of the row output signals $r_a \ldots r_n$ of the second decoder 16b is supplied to a respective control circuit $22a \ldots 22n$, with each control circuit $22a \ldots 22n$ having a corresponding first row line $R_{a1} \ldots R_{n1}$, and a corresponding second row line $R_{a2} \ldots R_{n2}$. Each of the control circuits 22 receives one of the row output signals $r_a \ldots r_n$ and the read/write signal W and the state of the input signal D, and in response thereto supplies an appropriate control signal to its corresponding first row line $R_{a1} \ldots R_{n2}$, and its corresponding second row line $R_{a2} \ldots Rn_{n2}$.

Within the first memory section 12a, the circuit 10 comprises a first column decoder 18a. The first column decoder 18a receives the column address signal $CA_0 \ldots CA_y$, which in accordance with industry standard can be the address signals $A_0 \ldots A_y$ supplied to the array circuit 10 strobed by a control signal CAS. The first decoder 18a also receives the row address signal $RA_x$ and the read/write signal W. In response, the first column decoder 18a selects one of the column lines $C_a \ldots C_m$ of the first memory section 12a. The first column decoder 18a is activated if the read/write signal W is high (indicating a read operation), or if the signal $RA_x$ is high.

Within the second memory section 12b, the circuit 10 comprises a second column decoder 18b. The second column decoder 18b receives the same column address signal $CA_0 \ldots CA_y$, as received by the first column decoder 18a, and the row address signal $\overline{RA_x}$ and the same read/write signal W. In response, the second column decoder 18b selects one of the column lines $C_a \ldots C_m$ of the second memory section 12b.

The second column decoder 18b is activated if the read/write signal W is high (indicating a read operation), or if the signal $\overline{RA_x}$ is high. Thus, in the event the read/write signal W is high, indicating a read operation, both column decoders 18a and 18b are activated. Since they both receive the same column signal $CA_0 \ldots CA_y$, the same column line $C_j$ will be chosen, causing the sense amp 14j to sense differentially the charges on the column line $C_j$ of the first memory section 12a from the column line $C_j$ of the second memory section 12b. In the event the read/write signal W is low, indicating a write operation, then only one of the column decoders 18a or 18b will be active. The choice of the column decoder 18a and 18b that will be active is determined by the signal $RA_x$ and $\overline{RA_x}$. If $RA_x$ is high, then only first column decoder 18a and only first row decoder 16a will be active, thereby activating only the column and row lines of the first memory section 12a. If $\overline{RA_x}$ is high, then only second column decoder 18b and only second row decoder 16b will be active, thereby activating only the column and row lines of the second memory section 12b.

The array 10 also comprises a conventional input buffer 20 for receiving a data signal D that is to be stored in one of the plurality of memory units 30aa ... 30nj of either the first memory section 12a or the second memory section 12b.

First Embodiment of a Memory Unit

Referring to FIG. 2, there is shown a memory unit 30 suitable for use with the memory array circuit 10. The memory unit 30 comprises an SRAM latch 50. The latch 50 comprises a first invertor 44a, having a first input 42a and a first output 46a. The latch 50 also comprises a second invertor 44b, having a second input 42b and a second output 46b. The first output 46a of the first invertor 44a is connected to the second input 42b of the second invertor 44b. The second output 46b of the second invertor 44b is connected to the first input 42a of the first invertor 44a.

As is well known, each of the invertors 44a and 44b has a first voltage node V1 for connection to a first voltage source and a second voltage node V2 for connection to a second voltage source. The first voltage node V1 of each of the first and second invertors 44a and 44b, respectively is connected to an associated first row line $R_{i1}$. The second voltage node V2 of each of the first and second invertors 44a and 44b, respectively is connected to an associated second row line $R_{i2}$. Schematically, FIG. 2 only shows invertor 44a as being connected to second row line $R_{i2}$ and invertor 44b as being connected to first row line $R_{i1}$, although it should be clear from the foregoing that each invertor 44a and 44b is connected to both row lines $R_{i1}$ and $R_{i2}$.

Figure 3A:
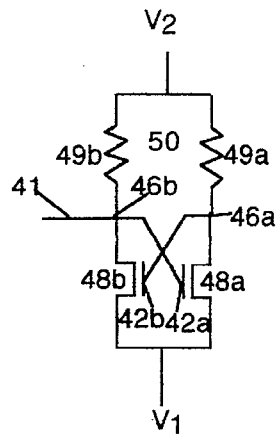
FIGS. 3a and 3b are two embodiments of types of latches that can be used in the SRAM memory cell shown in FIGS. 2, 9, 11a or 11b.

As shown in FIG. 3a, each of the invertors, e.g. 44a of the latch 50 can comprise an N type MOS transistor, e.g. 48a and a load 49a, e.g. a polysilicon resistor or diode. The gates of the N type MOS transistors 48a and 48b are cross coupled and are connected to the respective input and output nodes. Mother embodiment of the latch 50, shown in FIG. 3b, has each invertor 44, e.g. first invertor 44a comprising an N type MOS transistor 48a and a P type MOS transistor 47a, serving as the load. The gates of the N type MOS transistors 48a and 48b are cross coupled and connected to the respective input and output nodes. The gates of the P type MOS transistors 47a and 47b are also cross coupled and connected to the respective input and output nodes.

The memory unit 30 also comprises an avalanche diode 40, which has an anode 40a and a cathode 40b. As used herein, the term avalanche diode shall include zener diode or any other form of diode that has both a forward bias conduction state, and a reverse bias breakdown conduction state. The anode 40a is connected to the associated column line $C_j$. The cathode 40b is connected to the junction of the first input 42a and the second output 46b, which will hereafter be referred to as the data node 41 of the latch 50. Preferably, to reduce planar silicon area, the avalanche diode 40 can be made out of polysilicon and can be placed above the silicon substrate 80. Alternatively, the diode 40 can be fabricated in the semiconductor substrate.

As is well known, the latch 50 can be written into one of two states. For writing the latch 50 into state "1", (hereinafter described as program operation) the data node 41 would be written to "high" or "1", while the first output 46a would be in another state, which is complement to the one state, or is "low" or "0". For writing the latch 50 into state "0", (hereinafter described as erase operation), the data node 41 would be written to another state, while the second output 46a would be written to the one state, which is complement to the another state.

The principle of operation of writing is that voltages are applied to the select column line $C_j$, with the voltage on the select first row line $R_{i1}$ changed from V1 to cause either a forward conduction of the avalanche diode 40 or a reverse conduction of the avalanche diode 40. Thus, the control circuit 22 which changes the voltage to the select first row line $R_{i1}$ causing a program or erase operation, depends upon the voltage that is applied to the selected column line $C_j$. Furthermore, the principle of operation for reading the state of the memory unit 30 also depends upon the voltage precharged on the selected column line $C_j$ and the voltages applied to the selected first and second row lines $R_{i1}$ and $R_{i2}$, respectively, to cause a conduction of the avalanche diode 40, depending upon the state stored in the latch 50.

Figure 4:
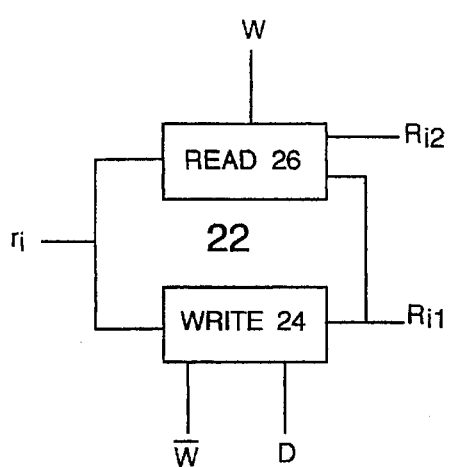
FIG. 4 is a block level diagram of an embodiment of a control circuit suitable for use in the first embodiment of the memory array circuit shown in FIG. 1.
Figure 6:
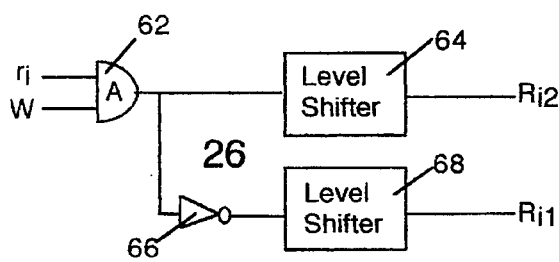
FIG. 6 is a circuit diagram of a read circuit suitable for use in the embodiment of the control circuit shown in FIG. 4.

Therefore, as shown in FIG. 4, the control circuit 22 comprises generally, a write circuit 24 for changing the voltage applied to the selected row line $R_{i1}$ during write operation, and a read circuit 26 for changing the voltages applied to the selected row lines $R_{i1}$ and $R_{i2}$ during read operation. The write circuit 24 and the read circuit 26 are shown in greater detail in FIGS. 5 and 6 respectively. However, based upon the previous discussion, for both read and write operation, the embodiment of the write circuit 24 and the read circuit 26 is only one of many possible embodiments depending upon the voltage of the selected column line $C_j$. Furthermore, for purpose of this discussion, the avalanche diode 40 is assumed to have a forward bias threshold voltage of +0.5 v and a reverse breakdown voltage of −5.0 volts. In addition, we shall assume the "normal" voltage of operation for the latches to be V1 at 0.0 volts, and V2 at 3.0 volts. For the purpose of describing the embodiment of the control circuit 22 shown in FIG. 4, the following voltages are assumed.

|  | $C_j$ | $C_i$ | $R_{i1}$ | $R_{i2}$ | $R_{j1}$ | $R_{j2}$ |
|---|---|---|---|---|---|---|
| Program | 0 | f | −3 | 3 | 0 | 3 |
| Erase | −3.5 | f | 1.5 | 3 | 0 | 3 |
| Read | −1 | f | −3 | 5 | 0 | 3 | where program is to write a data signal of "high" or "1" into the data node 41 of the select latch 50 defined at the intersection of column line $C_j$ and row line $R_i$. Erase is to write a data signal of "low" or "0" into the data node 41 of the select latch 50 defined at the intersection of column line $C_j$ and row line $R_i$. Read is to read the state of the data signal stored at the data node 41 of the select latch 50 defined at the intersection of column line $C_j$ and row line $R_i$. $C_i$ is an unselected column line. f is floating. $R_j$ is an unselected row line. $R_{i1}$ is the select first row line; with normally 0 volts applied thereto when unselected. $R_{i2}$ is the select second row line; with normally 3.0 volts applied thereto when unselected.

The voltages shown above also assume that the unselected column lines, e.g. $C_i$, are sufficiently insulated from the selected column line $C_j$ so that the unselected column lines may be maintained at a floating state during writing.

Figure 5:
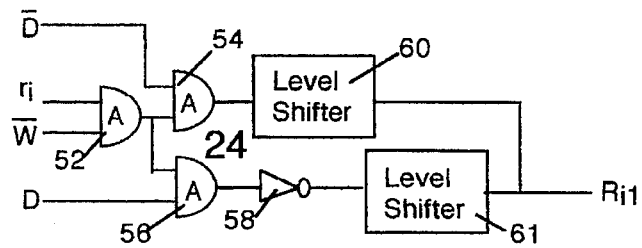
FIG. 5 is a circuit diagram of a write circuit suitable for use in the embodiments of the control circuit shown in FIGS. 4 and 13.

The write circuit 24 is shown in greater detail in FIG. 5. The write circuit 24 receives a row output signal $r_i$, which is the output of the row decoder 16a or 16b. The row output signal $r_i$ is supplied to a first AND gate 52, to which the read/write signal $\overline{W}$ is also supplied. The output of the first AND gate 52 is supplied to a second AND gate 54 to which the input signal $\overline{D}$ is also supplied. The output of the second AND gate 54 is supplied to a level shifter 60. The output of the level shifter 60 is supplied to the first row line $R_{i1}$. The output of the first AND gate 52 is also supplied to a third AND gate 56 to which the input signal D is also supplied. The output of the third AND gate 56 is inverted by an invertor 58. The output of the invertor 58 has its voltage level shifted by a voltage shifter 61 before being supplied to the first row line $R_{i1}$. The level shifters 60 and 61 are used solely to change the level of the voltage from the second AND gate 54 and the invertor 58, respectively, which are assumed to have outputs of +5/+0 volts corresponding to logic states of "1" or high and "0" or low respectively. The level shifter 60 changes the output of the AND gate 54 from 0 volts (unselect operation) and +5.0 volts (erase operation) to 0 volts (unselect operation) and +1.5 volts (erase operation). The level shifter 61 changes the output of the invertor 58 from +5.0 volts (unselect operation) and +0 volts (program operation) to 0 volts (unselect operation) to −3.0 volts (program operation). An example of a voltage level shifter for shifting an input signal of +5/0 volts and for outputting a signal of 0/−5 volts is shown in FIG. 8.

The read circuit 26 comprises an AND gate 62 which receives as its input the row output signal $r_i$ and the read/write signal W. The output of the AND gate 62 is supplied to a voltage level shifter 64, whose output is supplied to the second row line $R_{i2}$. The output of the AND gate 62 is also supplied to an invertor 66. The output of the invertor 66 is supplied to a second voltage level shifter 68, whose output is supplied to the first row line $R_{i1}$. Again, similar to the foregoing discussion, the purpose of the voltage level shifter 68 and 64 respectively is to shift the voltage level of the outputs of +5/+0 volts corresponding to logic states of "1" or high and "0" or low respectively. The level shifter 64 changes the output of the AND gate 62 from 0 volts (unselect operation) and +5.0 volts (read operation) to +3.0 volts (unselect operation) and +5.0 volts (read operation). The level shifter 68 changes the output of the invertor 66 from +5.0 volts (unselect operation) and +0 volts (read operation) to 0 volts (unselect operation) and −3.0 volts (read operation).

Figure 7:
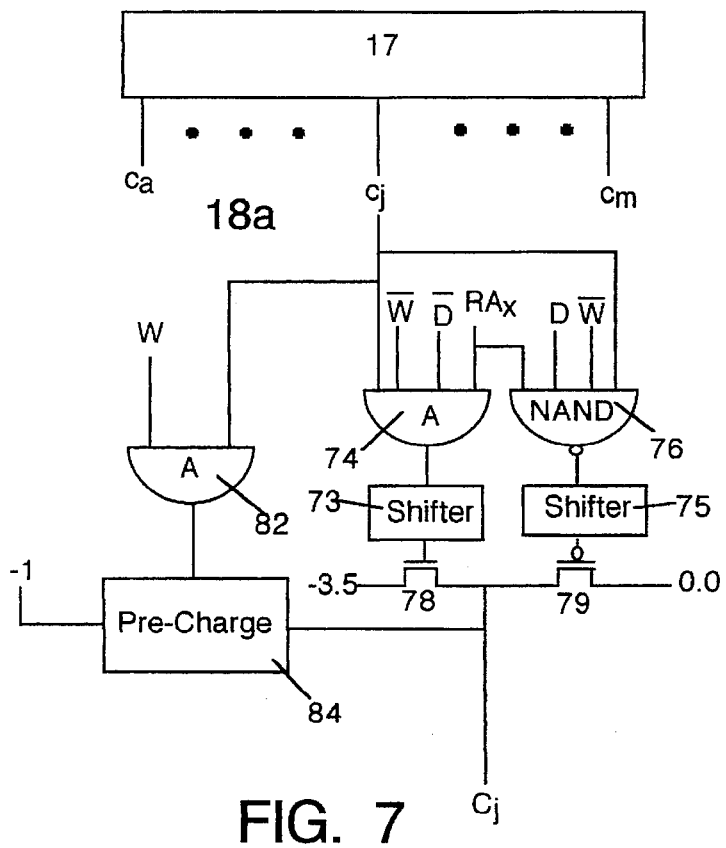
FIG. 7 is a circuit diagram of a portion of a column decoder suitable for use in the first embodiment of the memory array circuit shown in FIG. 1.

A portion of the column decoder 18a, which can supply the necessary voltages described above, is shown in greater detail in FIG. 7. The column decoder 18a comprises a conventional column decoder 17, having column output signals $c_a \ldots c_m$. Each column output signal, e.g. $c_j$ is supplied to a first AND gate 74 and a NAND gate 76. The other inputs to the first AND gate 74 are the read/write signal $\overline{W}$, the input data signal $\overline{D}$, and for the first memory section 12a, the row address signal $RA_x$. The other inputs to the NAND gate 76 are the read/write signal $\overline{W}$, the input data signal D, and for the first memory section 12a, the row address $RA_x$.

The output of the first AND gate 74 is supplied to a level shifter 73, which is then connected to the gate of a transistor 78. One of the drain/source regions of the transistor 78 is connected to the column line $C_j$. The other drain/source region of the transistor 78 is connected to −3.5 volts. The output of the NAND gate 76 is also supplied to a level shifter 75, whose output is supplied to the gate of a P type MOS transistor 79. One of the drain/source regions of the transistor 79 is connected to the column line $C_j$. The other drain/source region of the transistor 79 is connected to 0.0 volts. Similar to the foregoing discussion; the level shifters 73 and 75 are used solely to change the level of the voltage from the AND gate 74 and the NAND gate 76, respectively, which are assumed to have outputs of +5/+0 volts corresponding to logic states of "1" or high and "0" or low respectively. The level shifter 73 changes the output of the AND gate 74 from 0 volts (unselect operation) and +5.0 volts (erase operation) to −3.5 volts (unselect operation) and 0.0 volts (erase operation). The level shifter 75 changes the output of the NAND gate 76 from +5.0 volts (unselect operation) and +0 volts (program operation) to 0 volts (unselect operation) to −3.5 volts (program operation).

Finally, the column output signal $c_j$ is supplied to an AND gate 82 to which the read/write signal W is also supplied. The output of the AND gate 82 is used to activate a pre-charge circuit 84. The pre-charge circuit 84 is of conventional design, with one end connected to a −1 volt source, and the other end connected to the column line $C_j$. It can be as simple as a transistor.

Writing

The writing of the memory array circuit 10 with the SRAM cell 50 to a state of "1" or the programming of the data node 41 of the latch 50 is as follows. Prior to the program operation the various voltages on the to be selected column line $C_j$ and the to be selected first and second row lines $R_{i1}$ and $R_{i2}$ are as follows. The associated column line $c_j$ which is the output of the column decoder 17 is "0" or low. This causes the output of the AND gate 74 to be low. The voltage level shifter 73 will output −3.5 volts to the gate of the NMOS transistor 78. Since NMOS transistor 78 is assumed to be enhancement type, it is off. Therefore, column line $C_j$ will not be connected to −3.5 volts. Similarly, column line $C_j$ will not be connected to the voltage source 0.0 volts. Thus, column line $C_j$ is held floating. The to be selected first row line $R_{i1}$ is connected to 0.0 volts. Finally, the to be selected second row line $R_{i2}$ is connected to +3.0 volts.

If we assume that the data node 41 of the select latch 50 is erased, then it is at the voltage of the first row line $R_{i1}$, or 0.0 volts. The following actions will then occur.

1. The column decoder 17 will select the select column line $c_j$ changing it from 0.0 volts to +5.0 volts. For a write operation the read/write signal $\overline{W}$ is high. However, if the appropriate memory section 12a or 12b is selected then either $RA_x$ or $\overline{RA_x}$ will be on. If this is a program operation input signal D will also be high. This causes the output of the NAND gate 76 to be at 0.0 volts. The level shifter 76 outputs a −3.5 volts to the gate of the PMOS transistor 79, thereby turning it on, connecting the select column line $C_j$ to 0.0 volts.

2. At 0.0 volts supplied to the anode 40a of diode 40, and with data node 41 at 0.0 volts, the diode 40 does not conduct.

3. The appropriate row decoder 16a or 16b will be selected. For the appropriate memory section 12a or 12b, then either $RA_x$ or $\overline{RA_x}$ will be on. The appropriate row decoder 16a will output the particular row output signal $r_i$. For a write operation the read/write signal $\overline{W}$ will be high. Thus, the output of the selected AND gate 52 will be high. With input signal D high for programming, the output of AND gate 56 will also be high. This is inverted by invertor 58 to 0.0 volts. The level shifter 61 causes the voltage on the select first row line $R_{i1}$ to change from 0.0 volts to −3.0 volts. Since the data node 41 is erased, it follows the voltage at $R_{i1}$. Therefore, the lowering of the voltage on $R_{i1}$ causes the data node 41 to also drop to −3.0 volts.

4. Diode 40 now forward conducts, bringing data node 41 to approximately −0.5 volts. Since −0.5 volts on the gate of transistor 48a is greater than the source of transistor 48a, which is at −3.0 volts, transistor 48a will turn on. This causes the output 46a to be at −3.0 volts, which turns off transistor 48b. With transistor 48b off, the voltage at data node 41 will rise to the voltage of the second row line $R_{i2}$, or approximately +3.0 volts. This would turn off the forward conduction of the diode 40.

5. The voltage on the select first row line $R_{i1}$ is raised back to 0.0 volts.

If the data node 41 of the select latch 50 is programmed, then it will be at the voltage of the second row line $R_{i2}$, or 3.0 volts. The application of the voltage on the select column line $C_j$, the lowering of the select first row line $R_{i1}$ would all have no effect on the conduction state of the diode 40. Thus, the foregoing actions would have no effect on the state of the select latch 50 which is already programmed.

For an erase operation, the state of the various voltages on the to be selected column line $C_j$ and the to be selected first and second row lines $R_{i1}$ and $R_{i2}$, respectively, are as previously described. Column line $C_j$ is held floating. The to be selected first row line $R_{i1}$ is connected to 0.0 volts. The to be selected second row line $R_{i2}$ is connected to +3.0 volts.

If we assume that the data node 41 of the select latch 50 is programmed, then it will be at the voltage of the second row line $R_{i2}$, or 3.0 volts. The following actions will then occur.

1. The appropriate column decoder 17 will select the select column line $c_j$ changing it from 0.0 volts to +5.0 volts. If this is an erase operation input signal $\overline{D}$ will also be high. This causes the output of the AND gate 74 to be at 5.0 volts. The level shifter 73 outputs 0.0 volts to the gate of the MOS transistor 78, thereby turning it on, connecting the select column line $C_j$ to −3.5 volts.

2. At −3.5 volts supplied to the anode 40a of diode 40, and with data node 41 at +3.0 volts, the diode 41 will reverse conduct, dropping the voltage at data node 41 to +1.5 volts, or a differential of 5.0 volts from the select column line $C_j$.

3. The row decoder 16a will output the particular row output signal $r_i$. With input signal $\overline{D}$ high for erase, the output of AND gate 54 will also be high. The voltage is shifted by the level shifter 60 causing the voltage on the select first row line $R_{i1}$ to change from 0.0 volts to +1.5 volts. Since the voltage on the data node 41, which is the voltage on the gate of the transistor 48a, is the same as the voltage of the source of the transistor 48a, and since transistor 48a is assumed to be enhancement type, transistor 48a will be turned off.

4. This causes the output node 46a to rise to the voltage on the select second row line $R_{i2}$, or approximately 3.0 volts. This is applied to the gate of transistor 48b. Since this voltage is greater than the source of the transistor 48b, it turns on transistor 48b. With transistor 48b on, the voltage at data node 41 will be kept at +1.5 volts.

5. The voltage on the select first row line $R_{i1}$ is lowered back to 0.0 volts. Since the data node 41 is at the voltage of row line $R_{i1}$, the voltage at the data node 41 will drop to 0.0 volts.

If the data node 41 of the select latch 50 is already erased, then it is at the voltage of the first row line $R_{i1}$, or 0.0 volts. In addition, the transistor 48b would be on. The voltage on the select column line $C_j$ of −3.5 volts is insufficient to cause the diode 40 to reverse conduct. Thereafter, raising the voltage on the select first row line $R_{i1}$ to +1.5 volts would raise the voltage on the data node 41 to also +1.5 volts. However, although this would cause the associated diode 41 to reverse conduct, transistor 48b would still be on.

Write Disturbance

In the write "1" operation, where +0.0 volts is applied to the selected column line $C_j$, write disturbance on the latch 50 in the same row is minimized by keeping the unselected column lines $C_a$ ... $C_{(j-1)}C_{(j+1)}$ ... $C_m$ at floating, and sufficiently insulated from the selected column line $C_j$. For the latches 50 in the same column, but in different rows, write disturbance is minimized by keeping the voltage on the unselected first row lines $R_{a1}$ ... $R_{(i-1)1}R_{(i+1)1}$ ... $R_{n1}$ at +0.0 volt, resulting in the respective diodes 40 not conducting.

In the write "0" operation, where −3.5 volts is applied to the selected column line $C_j$, for the latches 50 in the same column but at different rows, if the latch 50 is already erased, the diode 40 would prevent the voltage on the select column line $C_j$ from being passed into the latch 50, so long as the voltage on the unselected first row lines $R_{a1}$ ... $R_{(i-1)1}R_{(i+1)1}$ ... $R_{n1}$ are maintained at 0.0 volts. For the latches 50 that are programmed, the voltage on the select column line $C_j$ would cause the voltage on the data node 41 to drop from the voltage of the second row line $R_{i2}$ to approximately +1.5 volts. This would still keep transistor 48a turned on, and transistor 48b off.

As for the memory units 30 in the same select row but in unselected columns, with the columns maintained floating, the raising and lowering of the voltage on the select first row line $R_{i1}$ has no effect on the transistors 48a and 48b.

During the write operation, the change in voltage to the selected first row line $R_{i1}$ depends upon the voltage applied to the selected column line $C_j$. Thus, many other voltage combinations are also possible. In addition, if it is difficult to maintain sufficient insulation between adjacent column lines, then the following voltages can be applied to minimize write disturbance.

|  | $C_j$ | $C_i$ | $R_{i1}$ | $R_{i2}$ | $R_{j1}$ | $R_{j2}$ |
|---|---|---|---|---|---|---|
| Program | 0 | −3 | −3 | 3 | 0 | 3 |
| Erase | −3.5 | −3 | 1.5 | 3 | 0 | 3 |

This would cause the diode 40 of the unselected latches 50, which are programmed, to reverse conduct lowering the voltage at the data node 41 to +2.0 volts, if the diodes 40 have a reverse conduction of −5.0 volts. However, this is a minor disturbance, which does not affect the state of the unselected latches 50. In addition, the disturbance during programming can be further minimized by lowering $C_i$ and $R_{i1}$ to only −2 volts.

Reading

The discussion which follows assumes the conditions for the avalanche diode 40 discussed previously, i.e. forward conduction of +0.5 volts, and reverse conduction of −5.0 volts. To read a select memory cell 50, assume that the memory cell 50ij is from the first memory section 12a. In that event row address signal $RA_x$ is high. In addition, for a read operation the read/write signal W is also high. The same select column line, e.g. $C_j$, of both memory sections 12a and 12b are first pre-charged. This can be done for example by applying a voltage source (−1.0 volt) to the selected column line $C_j$ of the first memory section 12a and the selected column line $C_j$ of the second memory section 12b, and equilibrating the two, i.e. connecting them together momentarily, then disconnecting the voltage source, and then maintaining the column lines $C_j$ of both memory sections 12a and 12b at floating.

After the select column lines $C_j$ are precharged, the voltage on the select first row line $R_{i1}$ and the select second row line $R_{i2}$ of the memory section containing the select latch 50 are changed from 0 volts to −3 volts, and from +3 volts to +5 volts, respectively.

If the select latch 50 in first memory section 12a is written to "0", i.e. with data node 41 at 0.0 volts, and with transistor 48b on, lowering the voltage on the select first row line $R_{i1}$ to −3 volts will also lower the data node 41 to −3 volts and cause the diode 40 to forward conduct. This would reduce the voltage on the select column line $C_j$ to approximately −2.5 volts.

If the select latch 50 in first memory section 12a is written to "1", i.e. with data node 41 at 3.0 volts, and with transistor 48b off, raising the voltage on the select second row line $R_{i2}$ to +5 volts will also raise the data node 41 to +5 volts and cause the diode 40 to reverse conduct. This would increase the voltage on the select column line $C_j$ to approximately 0.0 volts.

The amount of voltage on the column line $C_j$ connecting to the selected memory cell 50 in the selected memory section 12a is compared to the amount of voltage on the corresponding column line $C_j$ in the unselected memory section 12b. The differential sensing of the two column lines $C_j$ determines the state of the selected memory cell 50.

Second Embodiment of a Memory Unit

Figure 9:
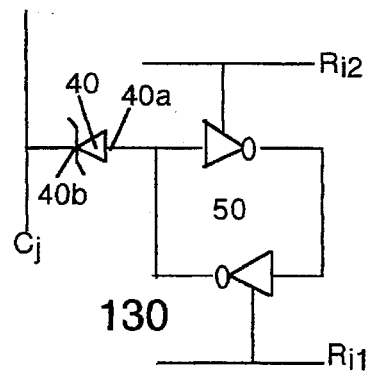
FIG. 9 is a circuit diagram of a second embodiment of a SRAM memory unit for use in the embodiment of the memory array circuit of the present invention shown in FIG. 1.

An alternative to the first embodiment of the memory unit 30 suitable for use in the memory array 10 is shown in FIG. 9. In the alternative embodiment, the memory unit 130 is similar to the memory unit 30. Therefore, like numerals will be used to designated identical parts. The memory unit 130 comprises a memory latch 50, which can be any of the embodiments shown in FIGS. 3a or 3b, and an avalanche diode 40 having an anode 40a and cathode 40b. The only difference from the memory unit 30 is that the anode 40a is connected to the data node 41 and the cathode 40b is connected to the column line $C_j$. In this embodiment, "1" on data node 41 is also assumed to be is +3 volts, and "0" on data node 41 is 0 volts. The diode 40 is assumed to have the same threshold voltage, and reverse conduction characteristics as that for the embodiment shown in FIG. 2. The following voltages are assumed for writing and reading.

|  | $C_j$ | $C_i$ | $R_{i1}$ | $R_{i2}$ | $R_{j1}$ | $R_{j2}$ |
|---|---|---|---|---|---|---|
| Program | 3.5 | f | −3 | 3 | 0 | 3 |
| Erase | 1.0 | f | 1.5 | 3 | 0 | 3 |
| Read | 3.0 | f | −3 | 5 | 0 | 3 |

Writing

The writing of the memory array circuit 10 with the memory unit 130 to a state of "1" or the programming of the data node 41 of the latch 50 is as follows. Prior to the program operation the various voltages on the to be selected column line $C_j$ and the to be selected first and second row lines $R_{i1}$ and $R_{i2}$ are as follows. The to be selected column line $C_j$ is held floating. The to be selected first row line $R_{i1}$ is connected to 0.0 volts. Finally, the to be selected second row line $R_{i2}$ is connected to +3.0 volts.

If we assume that the data node 41 of the select latch 50 is erased, then it will be at the voltage of the first row line $R_{i1}$, or 0.0 volts. A voltage of +3.5 volts is applied to the select column line $C_j$. The voltage on the select first row line $R_{i1}$ is lowered to −3.0 volts. This causes the voltage on the data node 41 to be lowered to −3.0 volts, which causes the diode 40 to reverse conduct, raising the voltage on the data node 41 to approximately −1.5 volts. Since this is greater than the voltage of the source on transistor 48a, it will cause transistor 48a to conduct. Transistor 48a conducting causes the output node 46a to be lowered to approximately −3.0 volts or the voltage of the select first row line $R_{i1}$. This then turns off the transistor 48b. With transistor 48b turned off, there is no current path between the select column line $C_j$ and the select first row line $R_{i1}$. The voltage at data node 41 would then be raised to the voltage of the second row line $R_{i2}$ or approximately 3.0 volts. This shuts off the action of the diode 40. Raising the voltage on the first row line $R_{i1}$ back to 0.0 volts completes the programming operation.

Similarly, if the data node 41 is already programmed, the first step of lowering the voltage on the first row line $R_{i1}$ would have no effect on the voltage on the data node 41. Thus, the latch 50 would remain in the programmed state.

The writing of the memory array circuit 10 with the memory unit 130 to a state of "0" or the erasing of the data node 41 of the latch 50 is as follows. If we assume that the data node 41 of the select latch 50 is programmed, then it will be at the voltage of the second row line $R_{i2}$, or 3.0 volts. A voltage of 1.0 volts is applied to the select column line $C_j$. This is sufficient to cause the diode 40 to forward conduct. Since the forward conduction voltage of the diode 40 is approximately 0.5 volts, the voltage on the data node 41 would drop to approximately 1.5 volts. The voltage on the select first row line $R_{i1}$ is raised to approximately 1.5 volts. This causes the voltage on the output node 46a of the transistor 48a to be raised to +3.0 volts, since the voltage on the gate of the transistor 48a is the same as the voltage of the source to the transistor 48a and transistor 48a would turn off. This voltage is then sufficient to turn on transistor 48b, which causes the data node 41 to be at the voltage of the first row line $R_{i1}$ or approximately +1.5 volts. Lowering the voltage on the first row line $R_{i1}$ to 0.0 volts and removing the voltage on the select column line $C_j$ lowers the voltage on the data node 41 to approximately 0.0 volts.

Similarly, if the data node 41 is already erased, the first step of applying the voltage on the select column line $C_j$ to 1.0 volts would have no effect because the associated diode 40 would not conduct.

Write Disturbance

The analysis for write disturbance for the embodiment of the memory unit 130 is similar to the discussion for the embodiment of the memory unit 30. In addition, as previously stated, many other voltage combinations are also possible. Finally, if the adjacent column lines cannot be sufficiently insulated, then the following voltages can be applied.

|  | $C_j$ | $C_i$ | $R_{i1}$ | $R_{i2}$ | $R_{j1}$ | $R_{j2}$ |
|---|---|---|---|---|---|---|
| Program | 3.5 | 2 | −3 | 3 | 0 | 3 |
| Erase | 1.0 | 3 | 1.5 | 3 | 0 | 3 |

Reading

The read operation for the memory unit 130 is similar to the read operation for the memory unit 30. The column line $C_j$ of the memory section 12a or 12b, containing the select memory latch 50, and the corresponding column line $C_j$ of the memory section 12b or 12a not containing the selected memory latch 50 are precharged to +3 volts.

After the select column lines $C_j$ are precharged, the voltage on the select first row line $R_{i1}$ and the select second row line $R_{i2}$ of the memory section 12a or 12b containing the select latch 50 are changed from 0 volts to −3 volts, and from +3 volts to +5 volts, respectively.

If the select latch 50 in first memory section 12a is written to "0", i.e. with data node 41 at 0.0 volts, and with transistor 48b on, lowering the voltage on the select first row line $R_{i1}$ to −3 volts will also lower the data node 41 to −3 volts and cause the diode 40 to reverse conduct. This would lower the voltage on the select column line $C_j$ to approximately +2.0 volts.

If the select latch 50 in first memory section 12a is written to "1", i.e. with data node 41 at 3.0 volts, and with transistor 48b off, raising the voltage on the select second row line $R_{i2}$ to +5 volts will also raise the data node 41 to +5 volts and cause the diode 40 to forward conduct. This would increase the voltage on the select column line $C_j$ to approximately +4.5 volts.

The change in the voltage on the column line $C_j$ connecting to the selected memory cell 50 in the selected memory section 12a is compared to the voltage on the corresponding column line $C_j$ in the unselected memory section 12b. The differential sensing of the two column lines $C_j$ determines the state of the selected memory cell 50.

Second Embodiment of a Memory Array Circuit

Figure 10:
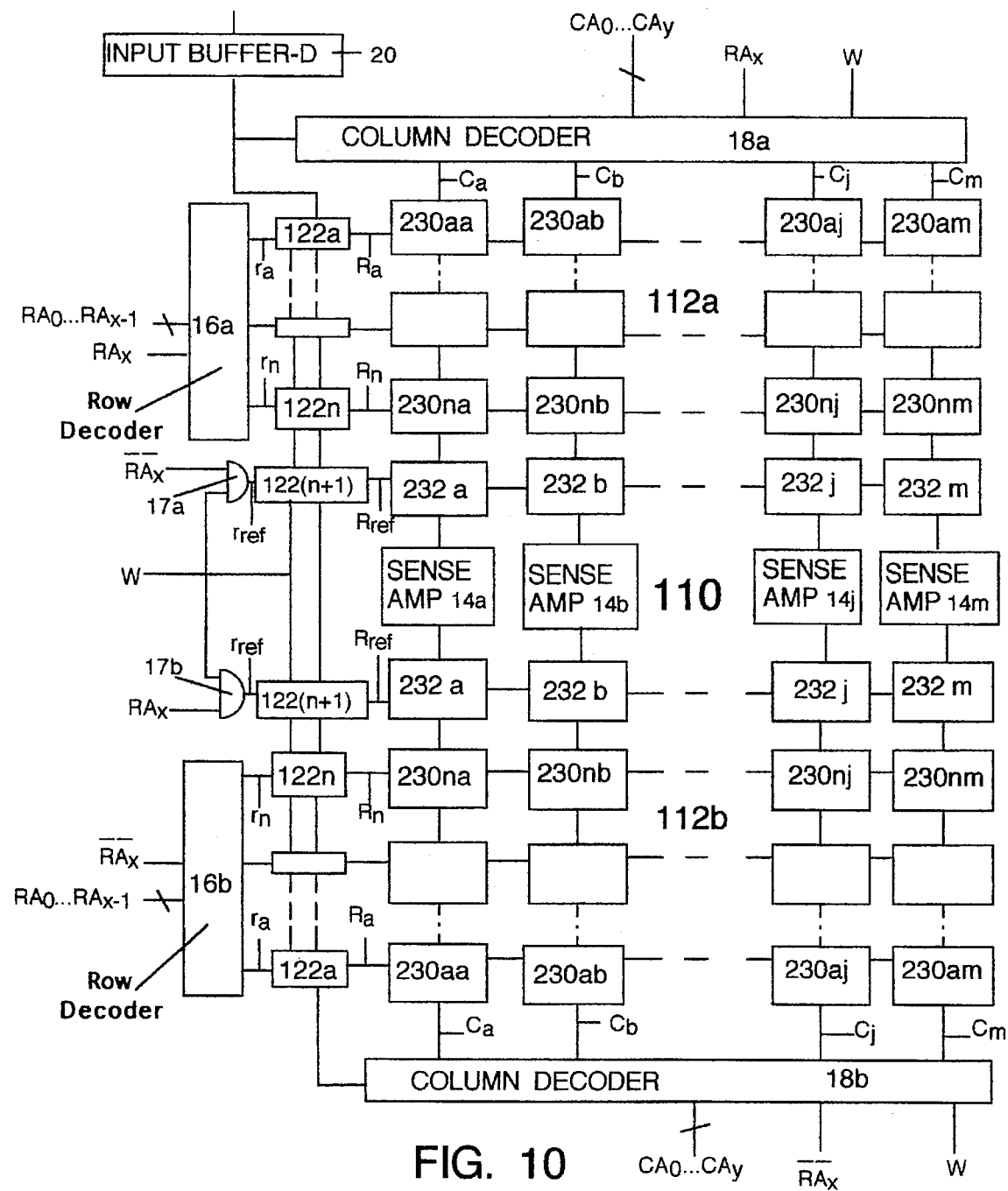
FIG. 10 is a schematic block level diagram of a second embodiment of a memory array circuit of the present invention, suitable for use with SRAM memory units comprising latches.

Referring to FIG. 10 there is shown a block diagram of a second embodiment of a semiconductor memory array circuit 110 of the present invention. The array circuit 110 is very similar to the array circuit 10 shown in FIG. 1 and as described above. Therefore, like numerals will be used for same or similar parts.

The basic difference between the array circuit 110 and the array circuit 10 is that the array circuit 10 requires two row lines $R_{i1}$ and $R_{i2}$ for each row of memory units 30. The memory circuit array 110 uses only a single row line $R_j$ for each row of memory units 230. However, this reduction in the number of row lines is achieved at a cost of using reference memory units 232a . . . 232m in each of the memory sections 112a and 112b for use during read operation.

Similar to the array circuit 10, the array circuit 110 comprises two sections of memory units: first memory section 112a and second memory section 112b. The first memory section 112a comprises a plurality of data memory units 230aa . . . 230nm arranged in a plurality of n rows and a plurality of m columns, connected by a plurality of n row lines $R_a$ . . . $R_n$ and a plurality of m column lines $C_a$ . . . $C_m$. The first memory section 112a also comprises a plurality of reference memory units 232a . . . 232m, connected in a single row $R_{ref}$ with one reference memory unit 232, e.g. 232j, connected to a different column line $C_j$ of the first memory section 112a.

The second memory section 112b also comprises a plurality of data memory units 230aa . . . 230nm also arranged in a plurality of n rows and a plurality of m columns, connected by a plurality of n row lines $R_a$ . . . $R_n$, and a plurality of m column lines $C_a$ . . . $C_m$. The second memory section 112b also comprises a plurality of reference memory units 232a . . . 232m, connected in a single row $R_{ref}$ with one reference memory unit 232, e.g. 232j, connected to a different column line $C_j$ of the second memory section 112b.

Figure 3B:
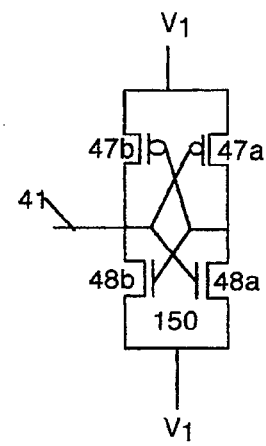
Figure 11A:
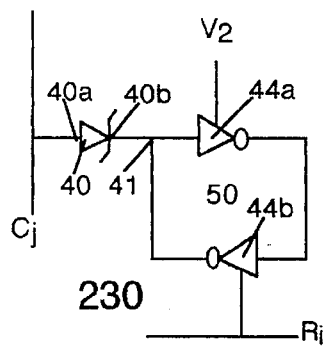
FIGS. 11a and 11b are two embodiments of memory units that can be used in the second embodiment of the memory array circuit shown in FIG. 10.
Figure 12A:
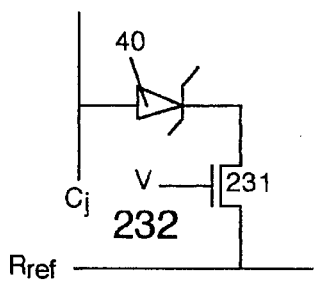
FIGS. 12a and 12b are circuit diagrams of reference units for use in the second embodiment of the memory array circuit shown in FIG. 10, with the memory units shown in FIGS. 11a and 11b, respectively.

Each of the memory units 230 shown in FIG. 11a comprises a SRAM memory latch 50 (shown in FIGS. 3a or 3b). The corresponding reference memory unit 232 is shown in FIGS. 12a.

A sense amplifier 14 is connected to a column line, e.g. $C_j$, of the first memory section 112a and to a corresponding column line, e.g. $C_j$, of the second memory section 112b. Each sense amplifier 14, e.g. 14j, differentially senses the voltage on a column line, e.g. $C_j$, of the first memory section 112a, caused by a data memory cell 50, e.g. any of the memory units 230aj . . . 230nj, of the first memory section 112a being connected thereto, with the voltage on a corresponding column line $C_j$, of the second memory section 112b, caused by a reference memory unit 232j of the second memory section 112b being connected thereto. The output of each sense amplifier 14 is supplied to an output buffer (not shown).

Within the first memory section 112a, the circuit 110 comprises a first row decoder 16a for receiving and decoding a row address signal $RA_0$ . . . $RA_{(x-1)}$. The first row decoder 16a also receives the row address signal $RA_x$. The first row decoder 16a decodes the row address signal $RA_0$ . . . $RA_{(x-1)}$, if the row address signal $RA_x$ is high. The output of the first row decoder 16a is a plurality of row output signals, $r_a$ . . . $r_n$. Each of the row output signals $r_a$ . . . $r_n$ of the first row decoder 16a is supplied to a control circuit 122a . . . 122n and has a corresponding row line $R_a$ . . . $R_n$. The row address signal $\overline{RA_x}$ and the read/write signal W are supplied to an AND gate 17a, to generate the row output signal $r_{ref}$. The row output signal $r_{ref}$ is similar to the row output signals $r_a$ . . . $r_n$ in that it is supplied to a control circuit 122(n+1), which can be identical to the other control circuits 122. However, since the reference cells 232 are used only during the read operation, the control circuit 122(n+1) associated therewith need to comprise only the read circuit 126 portion (see FIG. 13). The row output signal $r_{ref}$ has a corresponding row line $R_{ref}$ which is connected to all the reference memory units 232. Each of the control circuits 122 receives one of the row output signals $r_a$ . . . $r_n$, $r_{ref}$ and the read/write signal W and the state of the input signal D, and in response thereto, supplies an appropriate control signal to its corresponding row line $R_a$ . . . $R_n$, $R_{ref}$.

Within the second memory section 112b, the circuit 110 comprises a second row decoder 16b for receiving and decoding a row address signal $RA_0$ . . . $RA_{(x-1)}$, which is the same row address signal supplied to the first row decoder 16a. The second row decoder 16b also receives the row address signal $\overline{RA_x}$. The second row decoder 16b decodes the row address signal $RA_0$ . . . $RA_{(x-1)}$, if the row address signal $\overline{RA_x}$ is high. Thus, although the same row address signal $RA_0$ . . . $RA_{(x-1)}$ is supplied to both the first row decoder 16a and the second row decoder 16b, only one of them will be activated at any time, depending upon the row address signal $RA_x$.

Similar to the first row decoder 16a, the second row decoder 16b has a plurality of row output signals, $r_a$ . . . $r_n$. Each of the row output signals $r_a$ . . . $r_n$ of the second row decoder 16b is supplied to a control circuit 122a . . . 122n and has a corresponding row line $R_a$ . . . $R_n$. The row address signal $RA_x$ and the read/write signal W are supplied to art AND gate 17b to generate the row output signal $r_{ref}$. The row output signal $r_{ref}$ is similar to the row output signals $r_a$ . . . $r_n$ in that it is supplied to a control circuit 122(n+1), which can be identical to the other control circuits 122, and has a corresponding row line $R_{ref}$ which is connected to all the reference memory units 232. Each of the control circuits 122 receives one of the row output signals $r_a$ . . . $r_n$, $r_{ref}$ and the read/write signal W and the state of the input signal D, and in response thereto supplies an appropriate control signal to its corresponding row line $R_a$ . . . $R_n$, $R_{ref}$.

Within the first memory section 112a, the circuit 110 comprises a first column decoder 18a. Except for the pre-charge circuit 84 being connected to a source of −1 volts, the first column decoder 18a can be of the type shown in FIG. 7. Within the second memory section 112b, the circuit 110 comprises a second column decoder 18b. The second column decoder 18b receives the same column address signal $CA_0 \ldots CA_y$, as received by the first column decoder 18a, and the row address signal $\overline{RA_x}$ and the same read/write signal W. In response, the second column decoder 18b selects one of the column lines $C_a \ldots C_m$ of the second memory section 112b.

The second column decoder 18b is activated if the read/write signal W is high (indicating a read operation), or if the signal $\overline{RA_x}$ is high. Thus, in the event the read/write signal W is high, indicating a read operation, both column decoders 18a and 18b are activated. Since they both receive the same column address signal $CA_0 \ldots CA_y$, the same column line $C_j$ will be chosen, causing the sense amp 14j to sense differentially the charges on the column line $C_j$ of the first memory section 112a from the corresponding column line $C_j$ of the second memory section 112b. In the event the read/write signal W is low, indicating a write operation, then only one of the column decoders 18a or 18b will be active. The choice of the column decoder 18a and 18b that will be active is determined by the signal $RA_x$ and $\overline{RA_x}$. If $RA_x$ is high, then only first column decoder 18a and only first row decoder 16a will be active, thereby activating only the column and row lines of the first memory section 112a. If $\overline{RA_x}$ is high, then only second column decoder 18b and only second row decoder 16b will be active, thereby activating only the column and row lines of the second memory section 112b.

The array circuit 110 also comprises a conventional input buffer 20 for receiving a data signal D that is to be stored in one of the plurality of memory units 230aa . . . 230nj of either the first memory section 112a or the second memory section 112b.

First Embodiment of a Memory Unit

The memory unit 230, shown in FIG. 11a, which can be used with the circuit 110 is similar to the memory unit 30, shown in FIG. 2. The only difference is that in the memory unit 230, the second voltage node V2 of the latch 50 is connected to a source of voltage potential, whereas in the memory unit 30, the second voltage node V2 is connected to the second row line $R_{x2}$. Similar to the discussion for the memory unit 30, each of the latches 50 of the memory unit 230 can be of the type shown in FIGS. 3a or 3b. Finally, the avalanche diode 40 is assumed to have a forward bias threshold voltage of +0.5 v and a reverse breakdown voltage of −5.0 volts.

The reference memory unit 232 suitable for use with the memory unit 230 in the circuit 110 is shown in FIG. 12a. The reference memory unit 232 comprises an avalanche diode 40 and a N type MOS enhancement transistor 231. The diode 40 has its anode 40a connected to the column line $C_j$ and its cathode 40b connected to one of the drain/source regions of the transistor 231. The other source/drain region of the transistor 241 is connected to the row reference line $R_{ref}$. The gate of the transistor 241 is connected to a voltage source. As will be seen, for one embodiment this is 0.0 volts. Preferably, the transistor has a width which is one-half of the width of transistor 48a or 48b. Thus, when turn on with the same voltage, transistor 231 would conduct at one-half the rate of transistor 48a or 48b.

Figure 13:
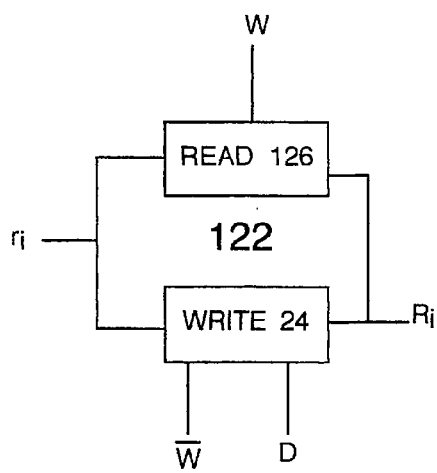
FIG. 13 is a block level diagram of an embodiment of a control circuit suitable for use in the second embodiment of the memory array circuit shown in FIG. 10.

As previously discussed, for read or write operations, depending upon the voltages on the selected column line $C_j$, the control circuit 122 shown in FIG. 13 is only one of many possible embodiments. For the purpose of describing the embodiment of the array circuit 110, the following voltages are assumed.

|         | $C_j$ | $C_i$ | $R_i$ | $R_j$ |
|---------|-------|-------|-------|-------|
| Program | 0     | f     | −3    | 0     |
| Erase   | −3.5  | f     | 1.5   | 0     |
| Read    | 0     | f     | −3    | 0     |

The voltages shown above also assumes that the unselected column lines $C_a \ldots C_{(j-1)} C_{(j+1)} \ldots C_m$ are sufficiently insulated from the selected column line $C_j$ so that the unselected column lines $C_a \ldots C_{(j-1)} C_{(j+1)} \ldots C_m$ may be maintained at a floating state.

Figure 14:
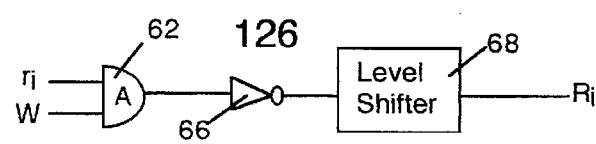
FIG. 14 is a circuit diagram of a read circuit suitable for use in the embodiment of the control circuit shown in FIG. 13.

The control circuit 122 for the array 110 is shown in greater detail in FIG. 13. The circuit 122 comprises a write circuit 24, shown in FIG. 5, and a read circuit 126. The read circuit 126 is shown in greater detail in FIG. 14. It comprises a portion of the read circuit 26. The read circuit 126 comprises an AND gate 62 which receives as its input the row output signal $r_i$ and the read/write signal W. The output of the AND gate 62 is supplied to an invertor 66. The output of the invertor 66 is supplied to a voltage level shifter 68, whose output is supplied to the row line $R_i$. As previously discussed, the purpose of the voltage level shifter 68 is to shift the voltage level of the outputs of +5/+0 volts corresponding to logic states of "1" or high and "0" or low respectively. The level shifter 68 changes the output of the invertor 66 from +5.0 volts (unselect operation) and +0 volts (read operation) to 0 volts (unselect operation) and −3.0 volts (read operation).

Writing

The writing of the memory array circuit 110 with the memory unit 230 to a state of "1" or "0" is identical to the operation described heretofore for the embodiment shown in FIG. 1, using the memory unit 30.

Write Disturbance

The discussion of the write disturbance of the select memory unit 230 for the array circuit 110 is identical to the discussion of the write disturbance of the select memory unit 30 for the array circuit 10, shown in FIG. 1. In addition, similar to the discussion for the write disturbance regarding the memory unit 30, the following voltages can be used if it is difficult to maintain insulation between adjacent column lines.

|         | $C_j$ | $C_i$ | $R_i$ | $R_j$ |
|---------|-------|-------|-------|-------|
| Program | 0     | −3    | −3    | 0     |
| Erase   | −3.5  | −3    | 1.5   | 0     |

Reading

To read the memory cell 50 of a select memory unit 230, assume that the memory cell 50ij is from the first memory section 112a. In that event row address signal $RA_x$ is high. In addition, for a read operation the read/write signal W is also high. The same select column line, e.g. $C_j$, of both memory sections 112a and 112b are first pre-charged to a voltage of 0.0 volts. This can be done for example by applying a voltage source to the selected column line $C_j$ of the first memory section 112a and the selected column line $C_j$ of the second memory section 112b, and equilibrating the two, i.e. connecting them together momentarily, then disconnecting the voltage source, and maintaining the column lines $C_j$ of both memory sections 112a and 112b at floating.

The select row line $R_i$ of the selected memory section 112a, selecting the select memory unit 230ij, and the reference row line $R_{ref}$ of the unselected memory section 112b are simultaneously lowered to −3.0 volts.

The change in the voltage on the selected row line $R_i$ of the first memory section 112a and the reference row line $R_{ref}$ of the second memory section 112b cause changes to the charges on the select column lines $C_j$ of the first and second memory sections 112a and 112b, which are differentially sensed. The result determines the state of charges in the select memory latch 50.

If the select memory cell 50 in first memory section 112a is set to "0", i.e. with zero volts on the data node 41, the lowering of the select row line $R_i$ would cause the diode 40 to be in a forward conduction mode. Similarly, the reference memory unit 232 in the unselect memory section 112b would also have its associated diode 40 in a forward conduction mode. However, since the transistor 48b of the latch 50 of the memory unit 230 has a larger current flowing capacity than the transistor 231 of the reference unit 232, the amount of charge drained from the column line $C_j$ of the first memory section 112a would be greater than the amount of charge drained from the column line $C_j$ of the second memory section 112b.

If the select memory latch 50 is programmed, i.e. with data node at +3.0 volts, the lowering of the voltage on the row line $R_i$ of the first memory section 112a would not cause the diode 40 to conduct. However, the reference memory unit 232 would still have its associated diode 40 in a forward conduction mode. Thus, the column line $C_j$ of the unselected or second memory section 112b would cause more charges to be drained than the column line $C_j$ of the first memory section 112a. Again the differential sensing of the charges on the column lines $C_j$ of the first memory section 112a and the second memory section 112b determines the state of the charges of the selected memory latch 50.

Second Embodiment of a Memory Unit

Figure 11B:
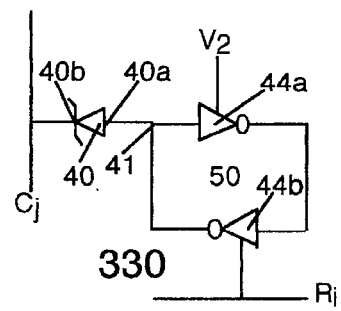
Figure 12B:
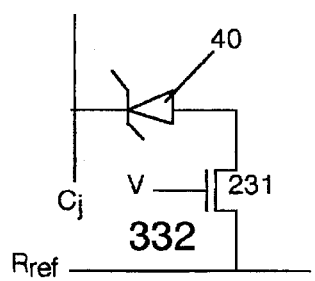

Similar to the discussion for the embodiment of the array circuit 10 using the alternative memory unit 130, an alternative memory unit 330, shown in FIG. 11b, can also be used in the memory array 110. The reference unit 332 associated with the memory unit 330 is shown in FIG. 12b. The reference unit 332 is identical to the reference unit 232, except the cathode 40b of the diode 40 is connected to the column line $C_j$. The voltage supplied to the gate of the NMOS enhancement transistor 241 is also at 0.0 volts. The analysis for writing and write disturbance is the same as that for the embodiment of the array circuit 10 using the memory unit 130, discussed previously. The only difference again is during the read operation. The voltages for the operation of the array circuit 110 with the memory unit 330 can be as follows:

|  | $C_j$ | $C_i$ | $R_i$ | $R_j$ |
|---|---|---|---|---|
| Program | 3.5 | f | −3 | 0 |
| Erase | 1.0 | f | 1.5 | 0 |
| Read | 4.0 | f | −3 | 0 |

In addition, the following voltages can be applied to minimize write disturbance.

|  | $C_j$ | $C_i$ | $R_i$ | $R_j$ |
|---|---|---|---|---|
| Program | 3.5 | 2 | −3 | 0 |
| Erase | 1.0 | 3 | 1.5 | 0 |

Reading

The read operation for the memory unit 330 is similar to the read operation for the memory unit 230. The column lines $C_j$ of the memory section 112a or 112b, containing the select memory cell 50, and the corresponding column line $C_j$ of the memory section 112b or 112a not containing the select memory cell 50 are precharged to +4 volts. The select row line $R_i$ of the select memory section 112a and the reference row line $R_{ref}$ of the unselect memory section 112b are then lowered simultaneously to −3.0 volts. The diode 40 of the reference memory unit 332 will reverse conduct. Thus, charges will be drained from the column line $C_j$ of the non-selected memory section 112b. If data node 41 of the select memory cell 50 is also set to "0", then more charges are drained from the select column line $C_j$ of the select memory section, due to the larger current flow capability of the transistor 48b of the select memory latch 50. If the select memory latch 50 is programmed, then the data node 41 is at 3.0 volts. Thus, no charge would be drained from the column line $C_j$ of the selected memory section 112a. The charges on the two select column lines $C_j$ of the two memory sections 112a and 112b are sensed differentially.

From the foregoing it can be seen that various embodiments of a memory array circuit using diodes to transfer charges to an SRAM latch results in greater compactness of the memory array circuit. Transistors with their planar requirement are not used. In addition, it should be noted that the term column lines and row lines can be interchanged.

Although the invention has been described as being used with a latch as the memory cell 50, it should be clear that the invention can also be used with a DRAM as the memory cell 50 or a non-volatile storage cell 50. Reference is made to U.S. patent applications, entitled "MEMORY CIRCUIT AND METHOD OF OPERATION THEREFOR" and "NON-VOLATILE MEMORY CIRCUIT AND METHOD OF OPERATION" filed even date herewith, whose disclosures are incorporated herein in their entirety by reference, which describes the use of the invention with a DRAM as the memory cell 50 or a non-volatile storage cell 50, respectively.

What is claimed is:

1. A memory circuit comprising:
    two memory sections, each memory section comprising:
        a plurality of first lines;
        a plurality of second lines;
        said plurality of first lines and plurality of second lines defining a matrix;
        a plurality of latches arranged in said matrix, with each latch having a data node, a first voltage node, and a second voltage node; each of said plurality of latches having an associated first line, and an associated second line, with said first voltage node connected to said associated second line;
        a plurality of avalanche diode means, each avalanche diode means connecting the data node of a latch to its associated first line;
        first decoder means for decoding a first address signal and for selecting one of said plurality of first lines, in response thereto;

second decoder means for decoding a second address signal and for generating one of a plurality of output signals in response thereto, each of said plurality of output signals having a corresponding second line; and a plurality of voltage control means each for receiving one of said plurality of output signals, and for applying a control signal to said corresponding second line, in response to a data read signal, a data write to one state signal or a data write to another state signal;

a plurality of sense amplifier means, each for differentially sensing a select first line of a first memory section from a corresponding select first line of a second memory section.

2. The memory circuit of claim 1 wherein said plurality of first lines are column lines, wherein said plurality of second lines are row lines, and wherein said plurality of latches in each memory section are defined in a plurality of rows and columns with the latches in the same column having the same associated first line, with the latches in the same row having the same associated second line.

3. The memory circuit of claim 2 further comprising:

means for precharging a select column line from a first memory section, and a select column line from the second memory section; and wherein said sense amplifier means for differentially sensing the charges on the select column line of the first memory section, and the select column line of the second memory section.

4. The memory circuit of claim 3 further comprising:

said second voltage node of said latches in the same row are connected to a voltage source;

a row of reference cells arranged in each of said memory sections with one reference cell in each column;

said second decoder means for generating a reference output signal;

a reference voltage control circuit for receiving said reference output signal, and for generating a reference voltage signal supplied to each of the reference cells in said row;

wherein said second decoder means for selecting a reference cell defined by said select column, and for selecting a select latch defined by a select row and a select column.

5. The memory circuit of claim 3 further comprising:

a plurality of third lines in each memory section with each of said third lines having an associated second line;

wherein said second voltage node of said latches in the same row are connected to said associated third line;

wherein each of said plurality of output signals has a corresponding third line; and wherein each of said plurality of voltage control means for receiving one of said plurality of output signals, and for applying a control signal to said corresponding second and third lines, in response to a data read signal, a data write to one state signal or a data write to another state signal.

6. A SRAM memory device comprising:

two memory sections, each memory section comprising:
a plurality of column lines;
a plurality of row lines;
said plurality of column lines and plurality of row lines defining a matrix;
a plurality of latches arranged in a plurality of substantially parallel first lines and a plurality of substantially parallel second lines, with the plurality of first lines substantially perpendicular to the plurality of second lines, each of said plurality of latches having a data node, and a first voltage node; wherein each of the latches arranged in the same first line has the same associated column line, and wherein each of the latches arranged in the same second line, has the same associated row line, with the first voltage node of each of the latches connected thereto;

a plurality of avalanche diodes, each avalanche diode connecting the data node of a latch to its associated column line;

first address decoder for decoding a first address signal and for selecting one of said plurality of column lines, in response thereto;

second address decoder for decoding a second address signal and for generating one of a plurality of output signals in response thereto, each of said plurality of output signals having a corresponding row line;

wherein the selection of one of said column lines and one of said row lines defines a select latch; and a plurality of voltage control circuit, each for receiving one of said plurality of output signals, and for applying a control signal to said corresponding row line, in response to a data read signal, a data write to one state signal or a data write to another state signal;

a plurality of sense amplifiers, each for differentially sensing a select column line of a first memory section from a corresponding select column line of a second memory section.

7. The memory circuit of claim 6 further comprising:

means for precharging a select column line from a first memory section, and a select column line from the second memory section; and wherein said sense amplifier means for differentially sensing the charges on the select column line of the first memory section, and the select column line of the second memory section.

8. The memory circuit of claim 7 further comprising:

said second voltage node of said latches in the same row are connected to a voltage source;

a row of reference cells arranged in each of said memory sections with one reference cell in each column;

said second decoder means for generating a reference output signal;

a reference voltage control circuit for receiving said reference output signal and for generating a reference voltage signal supplied to each of the reference cells in said row;

wherein said second decoder means for selecting a reference cell defined by said select column, and for selecting a select latch defined by a select row and a select column.

9. The memory circuit of claim 7 further comprising:

a plurality of third lines in each memory section with each of said third lines having an associated second line;

wherein said second voltage node of said latches in the same row are connected to said associated third line;

wherein each of said plurality of output signals has a corresponding third line; and wherein each of said plurality of voltage control means for receiving one of said plurality of output signals, and for applying a control signal to said corresponding second and third lines, in response to a data read signal, a data write to one state signal or a data write to another state signal.

10. The memory circuit of claim 9 further comprising:
means for precharging a select column line from a first memory section, and a select column line from the second memory section; and
wherein said sense amplifier means for differentially sensing the charges on the select column line of the first memory section, and the select column line of the second memory section.

11. A method of writing a select latch of a SRAM memory device to a first state or to a second state, said SRAM memory device having a plurality of first lines, a plurality of second lines, a plurality of latches arranged in a plurality of rows and columns with each latch having a data node, a first voltage node, and a second voltage node; each of said plurality of latches having an associated first line, and an associated second line, with said first voltage node connected to a first voltage source, and said second voltage node of said latches arranged in the same row connected to the same associated second line, having a second voltage supplied thereto; each of said plurality of latches further having an associated avalanche diode, with each avalanche diode connecting the data node of a plurality of latches arranged in the same column to the same associated first line; a first decoder for decoding a first address signal and for selecting one of said plurality of first lines, in response thereto; a second decoder for decoding a second address signal and for generating one of a plurality of output signals in response thereto, each of said plurality of output signals having a corresponding second line; and a plurality of voltage control means each for receiving one of said plurality of output signals, and for applying a control signal to said corresponding second line, said select latch having an associated select first line and an associated select second line, said method comprising:
writing said select latch to said first state by:
applying a third voltage to said associated select first line;
lowering said second voltage on said associated select second line to a fourth voltage;
conducting said avalanche diode associated with said select latch to maintain said data node at a fifth voltage, wherein said fifth voltage is between said first voltage and said fourth voltage;
removing said third voltage applied to said associated select first line;
writing said select latch to said second state by:
applying a sixth voltage to said select first line;
conducting said avalanche diode associated with said select latch to maintain said data node at a seventh voltage, wherein said seventh voltage is between said first voltage and said second voltage;
raising said second voltage on said associated select second line to substantially said seventh voltage; and
removing said sixth voltage applied to said select first line.

12. The method of claim 11 wherein said avalanche diode forward conducts in the writing of said select latch to said first state, and reverse conducts in the writing of said select latch to said second state.

13. The method of claim 11 wherein said avalanche diode forward conducts in the writing of said select latch to said second state, and reverse conducts in the writing of said select latch to said first state.

14. The method of claim 11 wherein said SRAM memory device further having a plurality of third lines, each third line having an associated second line, with the plurality of latches arranged in the same row having an associated second line and an associated third line, with the first voltage node of each latch arranged in the same row connected to the same associated third line with said first voltage supplied thereto; and wherein each of said plurality of output signals having a corresponding second line and a corresponding third line; and wherein each of said plurality of voltage control means for receiving one of said plurality of output signals and for applying a control signal to said corresponding second line, and said corresponding third line; and wherein said select latch having an associated select first line, an associated select second line, and an associated select third line.

15. The method of claim 14 wherein said process of writing said select latch to said second state further comprising:
increasing said first voltage to an eighth voltage on said associated select third line; and
wherein said seventh voltage is between said eighth voltage and said second voltage.

16. The method of claim 14 wherein said avalanche diode forward conducts in the writing of said select latch to said first state and reverse conducts in the writing of said select latch to said second state.

17. The method of claim 14 wherein said avalanche diode forward conducts in the writing of said select latch to said second state and reverse conducts in the writing of said select latch to said first state.

18. A method of reading a select latch of a SRAM memory device, said SRAM memory device having two memory sections, with each memory section having a plurality of first lines and a plurality of second lines with said plurality of first lines and plurality of second lines defining a matrix; the SRAM memory device further having a plurality of latches arranged in said matrix in a plurality of rows and columns with a reference cell in each column; each latch having a data node, a first voltage node having a first voltage supplied thereto, and a second voltage node; each latch arranged in the same column having an associated first line; each of said plurality of latches arranged in the same row having the same associated second line, with the second voltage node all connected to said same associated second line and with a second voltage supplied to said associated second line; a plurality of avalanche diode means, each avalanche diode means connecting the data node of a latch and a reference cell to its associated first line; first decoder means for decoding a first address signal and for selecting one of said plurality of first lines, in response thereto; second decoder means for decoding a second address signal and for generating one of a plurality of output signals in response thereto; each of said plurality of output signals having a corresponding second line; each of a plurality of voltage control means receives one of said plurality of output signals, and for applying a control signal to said corresponding second line; a plurality of sense amplifier means, each for differentially sensing a first line of a first memory section from a corresponding first line of a second memory section, said method comprising:
applying said second voltage to all of said plurality of second lines of a first memory section, and to at least one second line of a second memory section, wherein said one second line of said second memory section being supplied to the reference cells of said second memory section;
precharging a select one of said plurality of first lines of said first memory section, and a corresponding one of said plurality of first lines of said second memory section to a third voltage;

changing said second voltage to a fourth voltage of one of said plurality of second lines of said first memory section thereby selecting said select latch defined by said one second line and said one first line;

simultaneously changing said second voltage to a fourth voltage of another of said plurality of second lines of said second memory section thereby selecting a select reference cell defined by said another second line and said corresponding one first line of said second memory section; and differentially sensing the charge on said one first line of said first memory section and said corresponding one first line of said second memory section to determine the state of said select latch.

19. The method of claim 18 wherein said second voltage is decreased to said fourth voltage.

20. A method of reading a select latch of a SRAM memory device, said SRAM memory device having two memory sections, with each memory section having a plurality of first lines, a plurality of second lines, and a plurality of third lines, with said plurality of first lines and plurality of second lines defining a matrix, and with each third line having an associated second line; the SRAM memory device further having a plurality of latches arranged in said matrix in a plurality of rows and columns; each latch having a data node, a first voltage node, and a second voltage node; each latch arranged in the same column having an associated first line; each of said plurality of latches arranged in the same row having the same associated second line and the same associated third line, with the first voltage node of said latches in the same row all connected to the same associated third line, and with the second voltage node of said latches in the same row all connected to the same associated second line; a plurality of avalanche diode means, each avalanche diode means connecting the data node of a latch to its associated first line; first decoder means for decoding a first address signal and for selecting one of said plurality of first lines, in response thereto; second decoder means for decoding a second address signal and for generating one of a plurality of output signals in response thereto; each of said plurality of output signals having a corresponding second line and third line; each of a plurality of voltage control means receives one of said plurality of output signals, and for applying a control signal to said corresponding second line and corresponding third line; a plurality of sense amplifier means, each for differentially sensing a first line of a first memory section from a corresponding first line of a second memory section, said method comprising:

applying a first voltage to all of said plurality of third lines of said first memory section;

applying a second voltage to all of said plurality of second lines of said first memory section;

precharging a select one of said plurality of first lines of said first memory section, and a corresponding one of said plurality of first lines of said second memory section to a third voltage;

changing said second voltage to a fourth voltage of one of said plurality of second lines of said first memory section thereby selecting said select latch defined by said one second line and said one first line;

simultaneously changing said first voltage to a fifth voltage of a third line corresponding to said one second line;

differentially sensing the charge on said one first line of said first memory section and said corresponding one first line of said second memory section to determine the state of said select latch.

* * * * *